(12) United States Patent
Moennig

(10) Patent No.: US 6,445,515 B2
(45) Date of Patent: Sep. 3, 2002

(54) OPTICAL ELEMENT HOUSING OR MOUNTING CONNECTOR

(75) Inventor: Thomas Moennig, Huettlingen (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/839,958

(22) Filed: Apr. 19, 2001

(30) Foreign Application Priority Data

Apr. 20, 2000 (DE) .......................................... 100 19 562

(51) Int. Cl.[7] .................................................. G02B 7/02
(52) U.S. Cl. ........................................ 359/814; 359/824
(58) Field of Search ................................. 359/811, 814, 359/819, 821, 824, 822, 823, 827, 280; 310/328, 90.5

(56) References Cited

U.S. PATENT DOCUMENTS

| 4,905,031 A | * | 2/1990 | Mody ....................... 354/195.1 |
| 5,070,489 A | * | 12/1991 | Perry et al. ............... 369/44.16 |
| 5,973,863 A | * | 10/1999 | Hatasawa et al. ........... 359/823 |

* cited by examiner

Primary Examiner—Georgia Epps
Assistant Examiner—Saeed Seyrafi
(74) Attorney, Agent, or Firm—Wells St. John P.S.

(57) ABSTRACT

An optical element housing or mounting connector (4), in particular for lens elements (13) in lens systems (12) for semi-conductor-lithography projection printing machines, is provided with electro-permanent magnets (1), the electro-permanent magnets being magnetized by the magnetic field of a coil (5) connected to an activating device (8) in such a way that the housings or mountings (4) are connected to one another by magnetic forces.

17 Claims, 3 Drawing Sheets

OPTICAL ELEMENT HOUSING OR MOUNTING CONNECTOR

RELATED APPLICATIONS

This application relates to German patent application 100 19 562.8 filed Apr. 20, 2000; and to which Priority is claimed.

FIELD OF THE INVENTION

The invention relates to an optical element housing or mounting connector, in particular for lens elements in semiconductor-lithography projection printing machines.

BACKGROUND OF THE INVENTION

Mountings of lens elements for the forming of a lens system are generally connected to one another by a large number of screws arranged in a distributed manner around the circumference. However, the tightening forces of the screw connections produce certain deformations of the mounting and consequently of the lens elements or the optical system. In particular, depending on the number of screws, this produces a waviness, which has adverse effects on the optical element, for example a lens element. Although the deformation of the optical system generally takes place only in the nanometer range, under some circumstances this deformation is problematical, for example in semiconductor-lithography projection printing machines.

The present invention is based on the object of providing a connecting technique for mountings and housings of optical elements which does not produce any adverse effects on the optical system.

Electro-permanent magnets have previously been used in production engineering as clamping elements in order to fix workpieces for a machining operation and subsequently release them again after the workpiece has been machined. Electro-permanent magnets combine the essential design features of electro systems with those of cure permanent systems. In addition to permanent magnets, an excitation coil is provided. After switching on the excitation coil, the initially magnetically neutral permanent magnets are magnetized by the magnetic field of the coil. Once this activating operation has taken place, the current supply can be disconnected. The magnetic field and consequently the magnetic forces are subsequently generated exclusively by the action of the permanent magnets. Therefore, no further power needs to be supplied during the entire clamping and machining operation for machining the workpiece. The cable connection between the magnet and the control part is disconnected after activation of the magnet.

It has now been recognized in an inventive way that the principle of electro-permanent magnets as actual clamping devices can also be used for the permanent connection of mountings and housings or optical elements if they are integrated in a suitable way into mountings or housings or are connected to the mountings or housings.

One of the main advantages of the connector according to the invention is that mountings and housings can be adjusted exactly in relation to one another during assembly, with only very small or absolutely no adhering forces being present during the adjusting operation. This means that individual parts of the lens system can be displaced exactly, in order for example to be able to set the optical axis accurately. Only after completion of the adjusting operation is the electro-permanent magnet magnetized by the coil and receives its adhering force in this way for the exact connection of the individual mountings or housings to one another. The selected adhering force is sustained for a long time.

A further advantage of the connector according to the invention is that the clamping force can be controlled and set very accurately by appropriate activation of the coil.

According to the invention, the electro-permanent magnets make it possible to dispense with screw connections, at the same time not only avoiding deformations of the optical system but also significantly shortening the assembly time. In addition, mountings or housings no longer have to be drilled or threads cut during prefabrication, also making it possible to dispense with interrupted cuts. Furthermore, turned reliefs of outer mountings for screws are no longer required. Instances of circumferentially distributed waviness of the optical element are completely avoided, since there are no longer any irregular clamping effects caused by the screw connection.

A further advantage of the connector according to the invention is that, for example, lens-element mountings or any kind of drill-hole limitations can be turned through any angle and displaced in any way desired. This is of advantage particularly for lens system adjustment in systematic adjustment processes.

In an advantageous design of the invention, it may be provided that, for example, mountings or housings are provided with recesses in which an electro-permanent magnet is arranged in each case, or that an adjusting ring with an annular electro-permanent magnet is arranged in each case between two mountings or housings.

Depending on the arrangement of the electro-permanent magnets and possibly intermediate rings, the mountings can be magnetic or non-magnetic.

A very advantageous development, with a new application at the same time, is obtained if the optical element is designed as a manipulator in the z direction by a form of configuration of planar surfaces on which the magnetic force acts.

This configuration provides the possibility of changing or influencing a lens system with respect to its optical imaging. With the aid of a specific configuration of planar surfaces, for example in the form of open wedge surfaces or stepped ring surfaces, which are provided with subregions projecting freely on the inner circumference, the associated optical element, for example a lens element, can be deformed in a specifically selective way. On account of the projecting subregions, bending is applied by the induced magnetic force and this bending consequently also acts in the same way on the optical element, hereby a specifically selective deformation can be achieved as a z manipulator.

BRIEF DESCRIPTION OF THE DRAWINGS

Advantageous configurations and developments emerge from the remaining subclaims and from the exemplary embodiments described in principle below on the basis of the drawing, in which:

DETAILED DESCRIPTION

Figure 1:
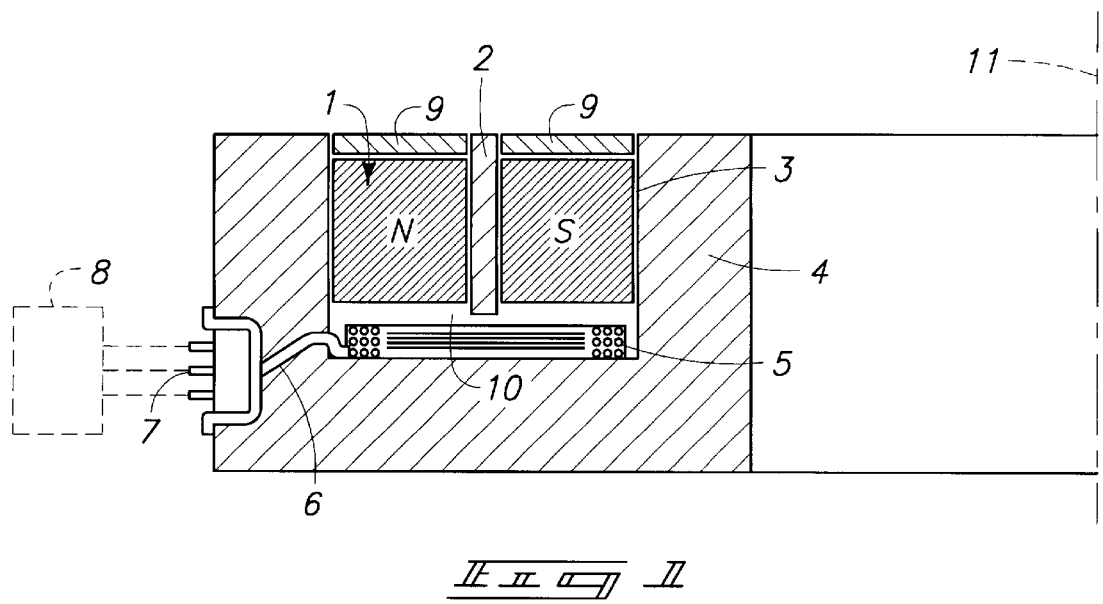
FIG. 1 shows an enlarged basic representation of an electro-permanent magnet built into a housing, for example into a lens-element mounting of a lens system.

Represented in FIG. 1 is a basic representation of an electro-permanent magnet 1 with annular pole division by a separating plate 2, for example made of brass. For this purpose, the electro-permanent magnet has an annular north pole and an annular south pole. The electro-permanent magnet 1 is built into a recess 3 of a housing, for example a lens-element mounting 4. In the recess 3 there is, underneath the two pole rings, which may be formed for example as AlNi cobalt magnets, a coil former 5, which is connected via connections 6 and an activating means 7 to an activating device 8 (represented by dashed lines) for the excitation of the said coil former. Once the magnet has been activated, the plug connection is disconnected. The previously input adhering force is sustained.

A respective terminating plate 9 terminates the two magnetic pole rings on the upper side of the recess 3. The counter-mounting consists of magnetizable steel. Only the upper connecting surface comprises in turn the magnetic pole rings described.

Figure 2:
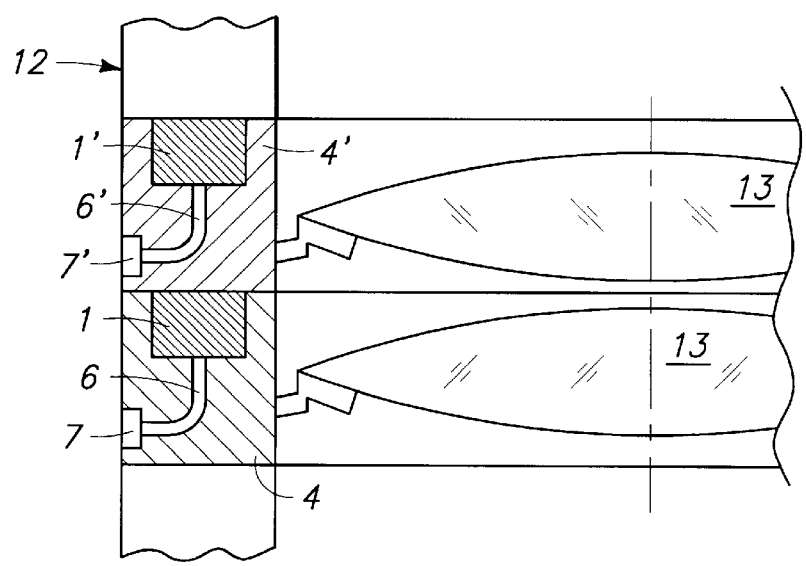
FIG. 2 shows electro-permanent magnets which are built into lens-element mountings.

As can be seen from the basic representation of FIG. 2, the lens-element mountings 4 and 4' may be parts of a lens system 12 (not represented in any more detail), for example for a semiconductor-lithography projection printing machine.

Figure 3:
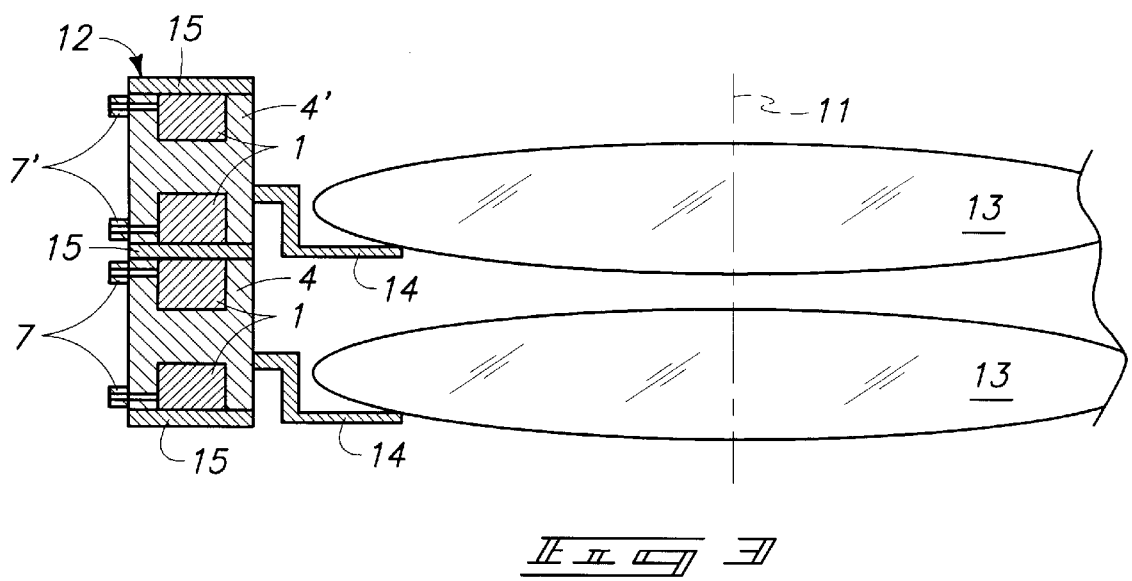
FIG. 3 shows a plurality of electro-permanent magnets built into lens-element mountings with adjusting rings lying in between, the adjusting rings being magnetizable.

FIG. 3 shows a similar configuration of a connector for two mountings 4 for lens elements of a likewise only partially represented lens system 12. As can be seen, when viewed in cross section, the mountings 4, 4' each have in this case the form of an H, with an electro-permanent magnet 1 being respectively arranged in the recesses thereby produced, the said magnet being connected via the activating means 7, which is no longer represented in any more detail in this case, to the associated connecting device 8 (not represented here).

For accurate setting of the spacing of the lens elements 13, an adjusting ring 15 is arranged between the two mountings 4, 4'. In the case of the exemplary embodiment represented in FIG. 3, the adjusting ring 15 is chosen to be made of a magnetic material in order to generate the adhering force between the mountings 4, 4', while the mountings 4, 4' themselves can be chosen to be made of a nor-magnetic material (for example ceramic). The same also applies to the other components.

Figure 4:
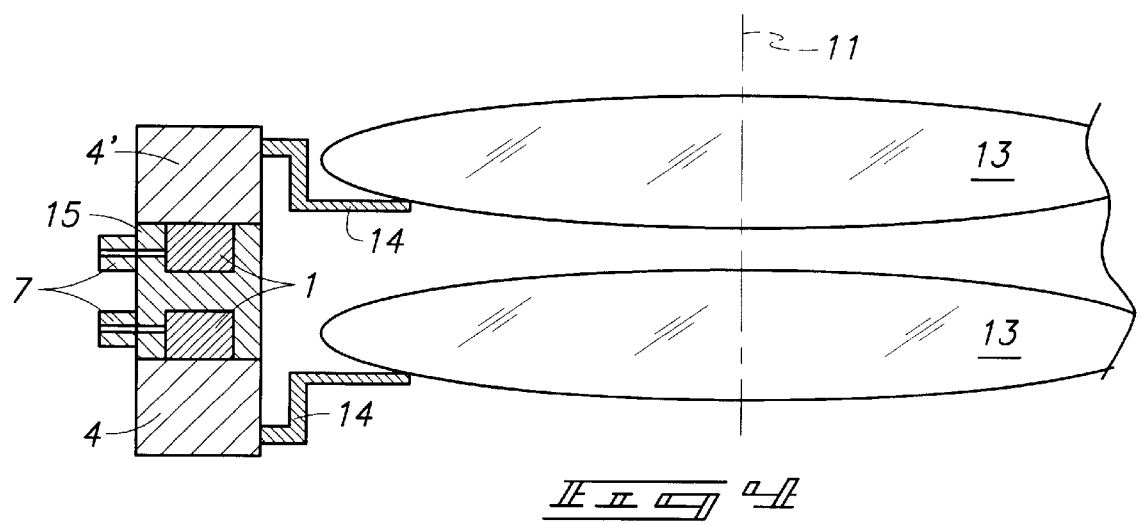
FIG. 4 shows two electro-permanent magnets built into an adjusting ring.

Represented in FIG. 4 is an exemplary embodiment in which two electro-permanent magnets 1 are fitted into an adjusting ring 15. For this purpose, the adjusting ring 15 is designed in the form of an H and an electro-permanent magnet 1 is fitted into each of the two recesses 3. When the electro-permanent magnets 1 are activated, the magnetic force produced connects the lens-element mountings 4, 4' arranged on both sides, which for this purpose consist of a magnetic material, separately from one another in an immovable manner via the adjusting ring 15.

Instead of the core former 5 being built into the recess, if need be it may also be arranged elsewhere for the activation of the electro-permanent magnets 1.

Figure 5A:
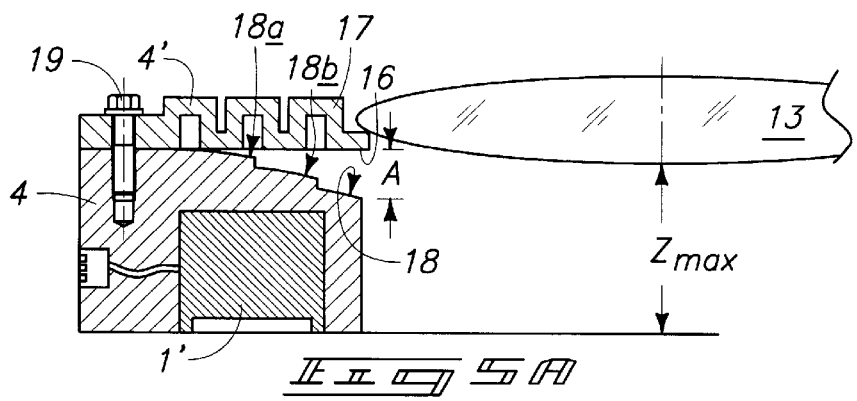
FIGS. 5a to 5c show basic representations of an electro-permanent magnet as a manipulator.
Figure 5B:
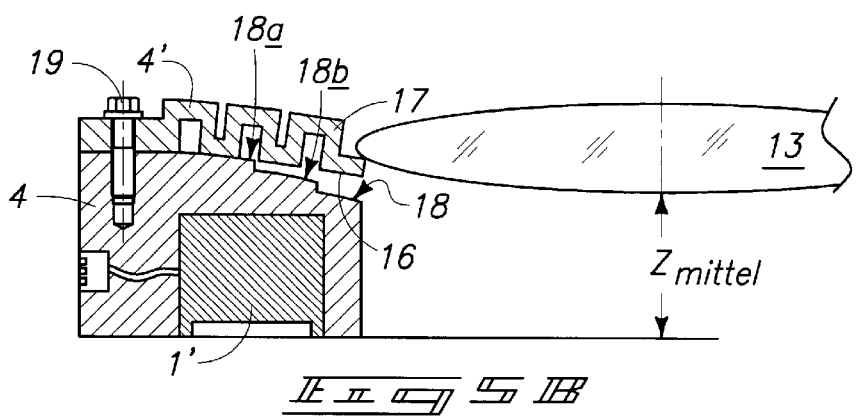
Figure 5C:
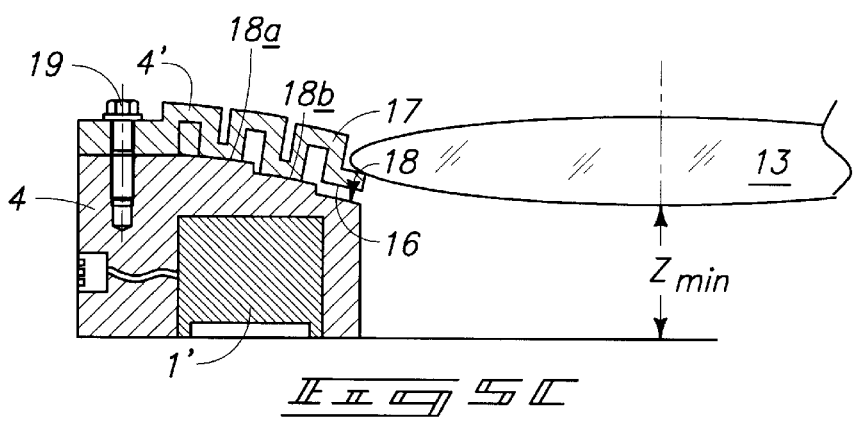

In FIGS. 5a to 5c, it is shown only in principle how one or more electro-permanent magnets 1 can be used to turn a lens-element mounting 4 or some other housing part with an optical element, for example a lens element 13 into a manipulator by which displacements in the z direction are possible. The electro-permanent magnet 1 can be used to produce z focusing adjustments of a lens element 13 in the finest range. As can be seen, a planar surface 16 of a mounting or a housing 4', on which the magnetic forces of the electro-permanent magnet or magnets 1' act, is formed on the inner circumference with a flexibly compliant subregion 17 projecting freely with respect to a bearing surface 18 of the housing or mounting part lying alongside or underneath it. The projecting subregion 17 may be distributed concentrically over the entire circumference or else be formed in the form of asymmetrical recesses (in the form of an active lens element (ALE)) or symmetrical recesses.

The arrangement of an electro-permanent magnet 1' in the region of the bearing surface 18 of the lens-element mounting 4 arranged underneath it has the effect that a magnetic force is exerted on the projecting subregion 17 when said magnet is activated. According to the magnetic force, the protecting subregion bends in a flexibly compliant manner, whereby the lens element 13 is displaced by a corresponding amount in the z direction. Although only displacements in the microns range are possible in this way, for semiconductor-lithography projection printing machines this manipulation represents a very expedient configuration and useful displacement to achieve the required high precision of a lens system. The electro-permanent magnet 1' may in this case be provided in addition to the electro-permanent magnet 1, which establishes the connection and the radial adjustments of neighboring mountings 4, 4'.

For the radial alignment of the mountings 4 and 4' before activation of the electro-permanent magnets 1, radial sensing tracks on the outer circumference of the mountings 4, 4' may be used in a known way.

The bearing surface 18 may be of a conical, wedge-shaped or else step-shaped design. A step-shaped design—as represented—with annular steps 18a and 18b—has the advantage that, for example when there is a projecting subregion 17 in a meandering form, greater bearing regions, which have a defined bearing surface, are created in a manipulation of the lens element 13'.

FIG. 5a shows the starting situation, the adhering force still being zero and the distance of the lens element 13 from the lower edge of the mounting 4 being $z_{max}$. The maximum displacement of the lens element 13 in the z direction is A.

FIG. 5b shows an adhering force with an assumed first step, the projecting subregion 17 striking with its planar surface 16 of the mounting 4' against the first step 18a. The distance of the lens element 13 from the lower edge of the mounting 4 is in this case $z_{mid}$.

FIG. 5c shows the greatest adhering force step, the flexible subregion 17 coming to bear with its planar surface 16 additionally also against the step 18b. The distance of the lens element 13 from the lower edge of the mounting 4 is in this case $z_{min}$. The inner region of the bearing surface 18, which is likewise stepped with respect to the step 18b, is at a distance from the subregion 17, so that a force-free flexible mounting of the lens element 13 remains. The mounting 4' or the housing part and the mounting 4 can be connected to one another by screw connections 19. However, it goes without saying that it is also possible for there to be arranged in addition to the electro-permanent magnet 1' in the radial outer region a second annular electro-permanent magnet 1, which after its activation connects the mountings 4 and 4' to one another.

Figure 6:
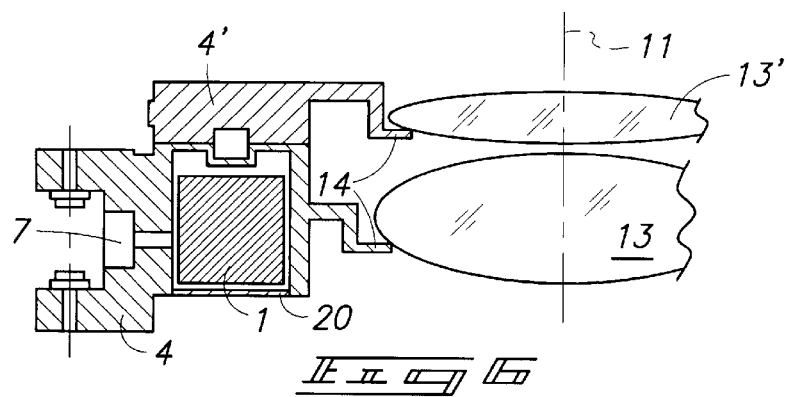
FIG. 6 shows a mounting technique with an electro-permanent magnet for a correction lens.

In FIG. 6, the use of an electro-permanent magnet 1 in mounting technology for a correction lens element 13' is represented in principle. In this case, the mountings 4 for the normal lens elements are connected to one another in a conventional way by means of a screwing technique. It goes without saying, however, that electro-permanent magnets 1 may also be used for connecting the conventional lens elements 13. With the connection according to the invention of the mounting 4' for the correction lens element 13' to the mounting 4 lying underneath it, a reproducible separating location is achieved. For this purpose, the mounting 4 lying underneath is provided with the electro-permanent magnet 1.

During renewed mounting of the correction lens element 13' after a precision machining step, it is intended that no further, new errors can creep in. As distinct from a connection by means of a screwing technique, this is now achieved by the connection with the electro- permanent magnet 1, since new changes such as those which car occur in the case of the conventional screwing technique cannot occur. The opening for fitting in the electro-permanent magnet 1 is in this case closed by a terminating plate 20.

What is claimed is:

1. An optical element housing or mounting connector, in particular for lens elements in lens systems for semiconductor-lithography projection printing machines, by electro-permanent magnets, the electro-permanent magnets being magnetized by the magnetic field of a coil connected to an activating device in such a way that the mountings or housings are connected to one another by magnetic force.

2. The connector as claimed in claim 1, wherein the mountings or housings are provided with recesses in which an electro-permanent magnet is arranged.

3. The connector as claimed in claim 1, wherein an adjusting ring with at least one electro-permanent magnet is arranged between two mountings or housings.

4. The connector as claimed in claim 3, wherein the mountings or housings are magnetic.

5. The connector as claimed in claim 1, wherein an adjusting ring of magnetic material is arranged between the mountings or housings.

6. The connector as claimed in claim 1, wherein the optical element is manipulated by the magnet in a prescribed direction by way of a configuration of planar surfaces of the housing or the mounting on which the magnetic force acts.

7. The connector as claimed in claim 6, wherein at least one planar surface is formed at least approximately as an annular surface which is provided with flexibly compliant subregions projecting freely with respect to a bearing surface of a neighboring housing or mounting part, at least partially over circumferential regions.

8. The connector as claimed in claim 7, wherein the subregions are formed in a meandering form.

9. The connector as claimed in claim 7, wherein the bearing surface is formed in a wedge-shaped manner.

10. The connector as claimed in claim 1, characterized in that the mounting or the housing is provided for a correction lens element.

11. The connector as claimed by claim 7 wherein the bearing surface is formed in steps.

12. An optical assembly comprising at least two optical elements, arranged in housings or mountings, at least one part of one of said housings or mountings being magnetic, at least a second part of another one of said mountings comprising an electro-permanent magnet, said magnetic part and said electro-permanent magnet magnetically fixing said one and other of said housings or mountings relative to each other.

13. The assembly as claimed in claim 12, comprising at least one recess, in which an electro-permanent magnet is arranged in one of said mountings or housings.

14. An optical assembly comprising at least two mountings or housings with attached optical elements, at least one spacer element arranged between two of said mountings or housings, an electro-permanent magnetic coupling being arranged between at least two of said mountings or housings and said spacer element, providing a force joint.

15. An optical assembly according to claim 14, comprising at least one electro-permanent magnet as part of said at least one spacer element.

16. An optical assembly comprising a first mounting part and a second mounting part and an optical element, one of said mounting parts being fixedly attached to said optical element, one of said mounting parts being fitted with at least one electro-permanent magnet, one of said mounting parts being a flexure part, the position of said optical element being adjustable by variable flexure of said flexure part, which is varied by a variable activating current of said electro permanent magnet.

17. A method of connecting mountings or housings of optical elements in lens systems of microlithography projection exposure machines by providing electro-permanent magnets, adjusting relative position of mountings or housings and subsequently activating said electro-permanent magnets by an electric current to magnetically hold the mountings or housings together in their adjusted positions.

\* \* \* \* \*

UNITED STATES PATENT AND TRADEMARK OFFICE
CERTIFICATE OF CORRECTION

PATENT NO. : 6,445,515 B2
DATED : September 3, 2002
INVENTOR(S) : Thomas Moennig It is certified that error appears in the above-identified patent and that said Letters Patent is hereby corrected as shown below:

Column 1,
Line 38, replace "electro systems with those of cure permanent" with
-- electro systems with those of pure permanent --
Line 55, replace "mountings and housings or optical elements if" with
-- mountings and housings for optical elements if --

Column 2,
Line 49, replace "optical element, hereby a specifically selective" with
-- optical element, whereby a specifically selective --

Column 3,
Line 48, replace "can be chosen to be made of a nor-magnetic" with
-- can be chosen to be made of a non-magnetic --

Signed and Sealed this

Fourth Day of March, 2003

JAMES E. ROGAN
*Director of the United States Patent and Trademark Office*